United States Patent
Ng et al.

(10) Patent No.: US 7,728,655 B2
(45) Date of Patent: Jun. 1, 2010

(54) CURRENT LIMITING LOAD SWITCH WITH DYNAMICALLY GENERATED TRACKING REFERENCE VOLTAGE

(75) Inventors: Kevin Ng, Fremont, CA (US); Zhinan Wei, San Jose, CA (US); Wai-Keung Peter Cheng, Union City, CA (US); Allen Chang, Fremont, CA (US)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 0 days.

(21) Appl. No.: 12/249,162

(22) Filed: Oct. 10, 2008

(65) Prior Publication Data

US 2010/0090755 A1   Apr. 15, 2010

(51) Int. Cl.
  *G05F 3/02* (2006.01)
(52) U.S. Cl. ...................................... 327/543
(58) Field of Classification Search ........................ None
  See application file for complete search history.

(56) References Cited

U.S. PATENT DOCUMENTS 6,304,108 B1 * 10/2001 Inn .............................. 327/72
2005/0068092 A1 * 3/2005 Sano ........................... 327/541
2005/0206444 A1 * 9/2005 Perez .......................... 327/540

* cited by examiner

*Primary Examiner*—Lincoln Donovan
*Assistant Examiner*—Khareem E Almo
(74) *Attorney, Agent, or Firm*—Chein-Hwa Tsao; CH Emily LLC

(57) ABSTRACT

A current limiting load switch for bridging supply Vss and load with a reference voltage $VR_{dt}$ dynamically generated by a $VR_{dt}$-generator is proposed. It includes: A pair of power FET and sense FET interconnected in split-current configuration. The FET pair develops a load voltage while limiting load current Iload to a preset maximum Imax. The FET pair is sized to draw device currents Ipower and Is with $RATIO_I = Is/Ipower \ll 1$. The sense FET high-side terminal is coupled to Vss through a sense resistor Rsense developing a sense voltage $Vs = Is \times Rsense$. A current limiting amplifier with inputs connected to $VR_{dt}$ and Vs and output controlling FET pair closing a current limiting feedback loop. The $VR_{dt}$-generator dynamically adjusts $VR_{dt}$ concurrent and compensatory with an undesirable effect of changing $RATIO_I$ caused by the sense FET operational transition thus eliminating a transitional overshoot of Iload beyond Imax.

11 Claims, 6 Drawing Sheets

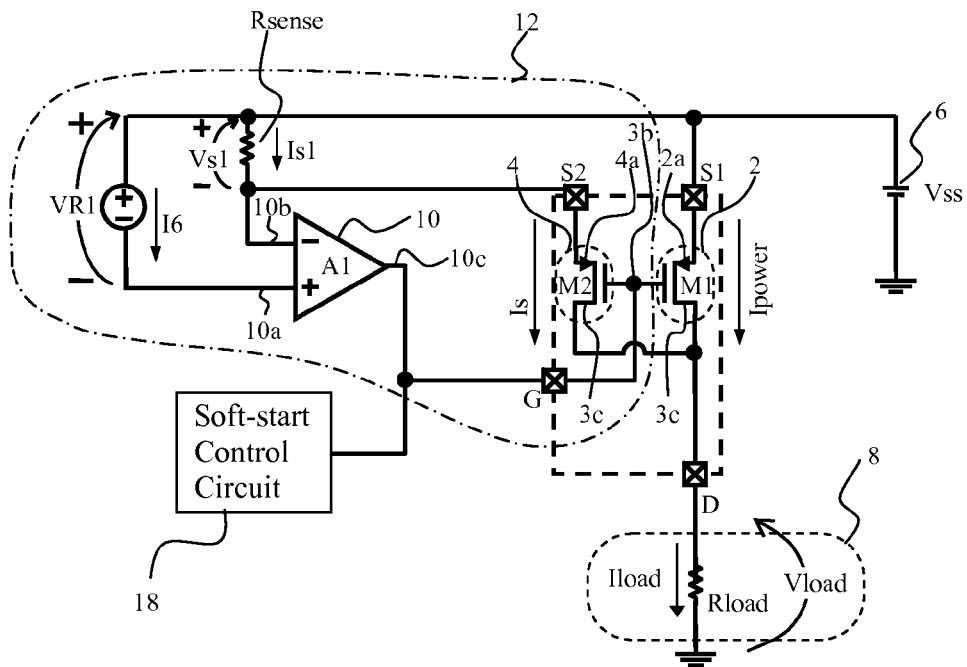
Fig. 1C Prior Art (Region A)
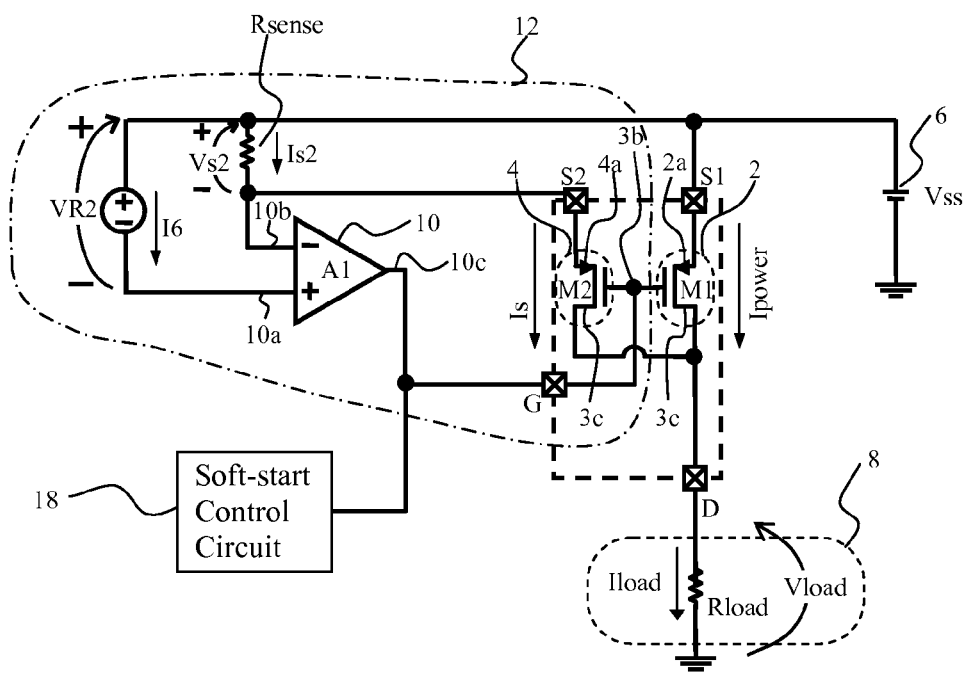
Fig. 1D Prior Art (Region B)

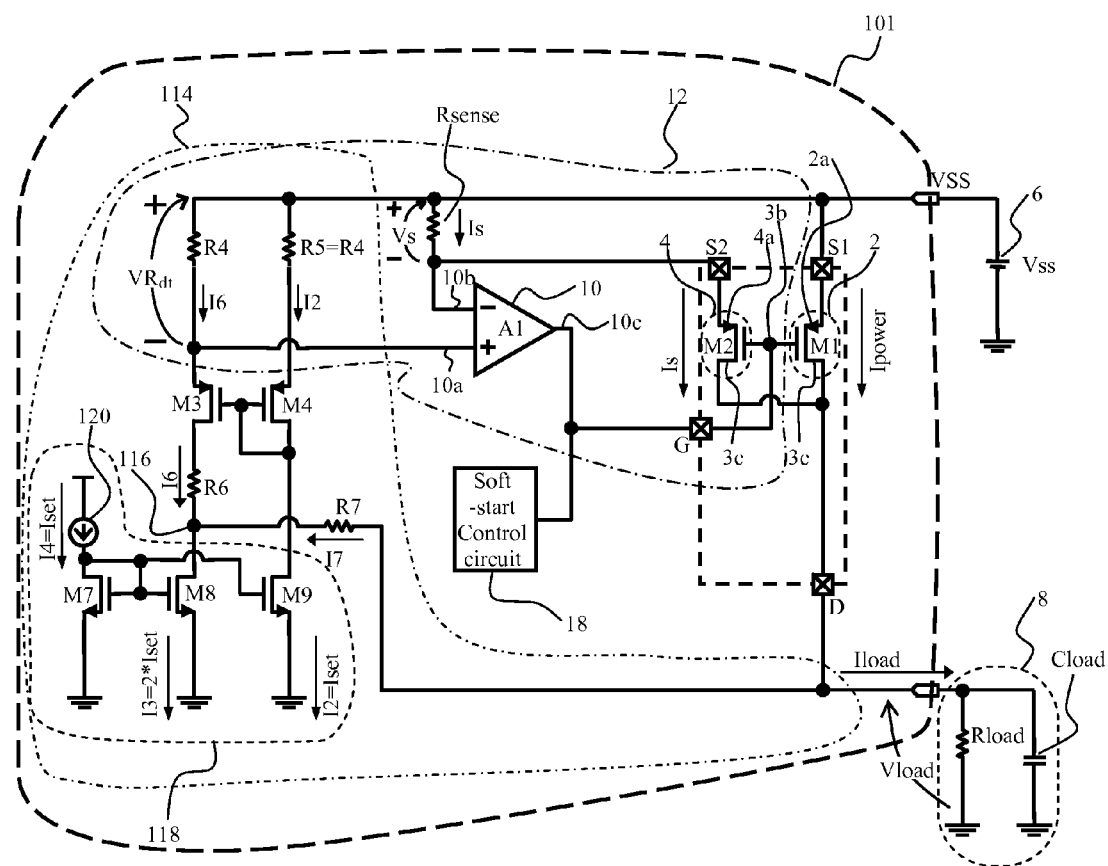
Fig. 2A Present Invention

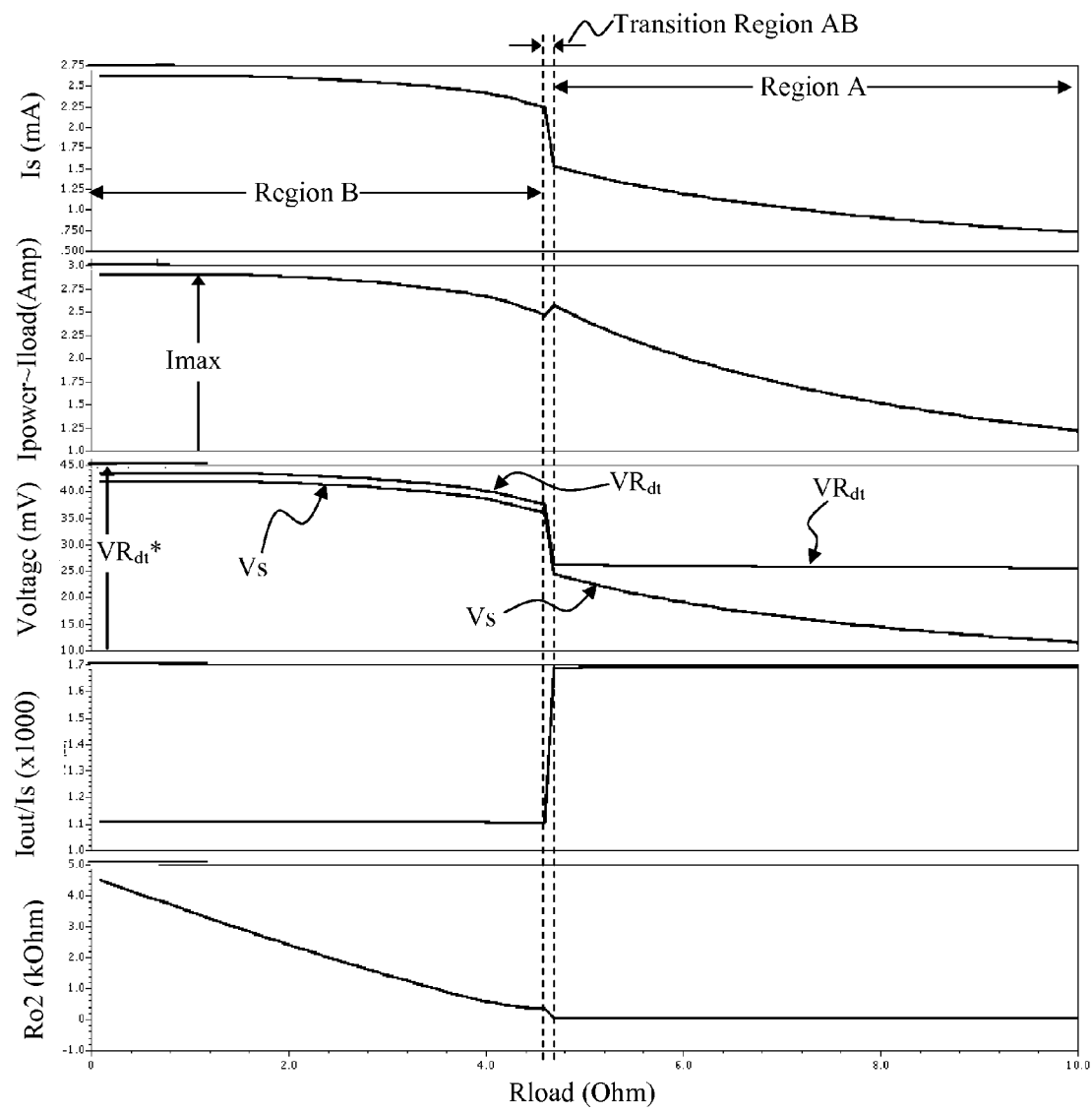
Fig. 2B Present Invention

CURRENT LIMITING LOAD SWITCH WITH DYNAMICALLY GENERATED TRACKING REFERENCE VOLTAGE

CROSS REFERENCE TO RELATED APPLICATIONS

Field of Invention

This invention relates generally to the field of electrical power supply. More specifically, the present invention is directed to the design of a load switch for protecting an electrical power supply and/or its load.

BACKGROUND OF THE INVENTION

In the field of power electronics, a load switch is commonly employed to couple a power supply to a load. The load switch functions to connect and disconnect the power supply and the load. When properly designed, the load switch can also protect both the power supply and the load against faulty conditions. The following are example functions of a load switch:

- External enable-signal controlled power switch between power supply and load
- Under-voltage lock-out
- Slew-rate control to adjust rising rate of load voltage with reduced inrush load current to avoid faulty conditions like CMOS device latch-up. This is also called soft-start in the art
- Load current-limiting to avoid hardware damage upon short circuit
- Thermal shutdown of load power to avoid hardware overheat FIG. 1A illustrates a prior art current limiting load switch (CLLS) 1 for coupling an external power supply Vss 6 to an external load 8. In this case, the external load 8 is a parallel connection of a resistive Rload and a capacitive Cload. Thus, the prior art CLLS 1 delivers a load current Iload to the external load 8 while maintaining a load voltage Vload across it. A power field effect transistor (FET) M1 2 with a low on-resistance Rdson, in this case a P-channel metal-oxide-semiconductor (PMOS) FET, functions as a pass transistor to connect and disconnect the external power supply Vss 6 to the external load 8. Thus, when it is desirable to disconnect the external load 8 from the external power supply Vss 6 the power FET M1 2 will be fully turned OFF.

The prior art CLLS 1 limits the load current Iload to a pre-settable maximum Imax with a feedback loop 12 having a preset fixed reference voltage VR. The fixed reference voltage VR is generated with a pre-settable current mirror 16. During normal operation, the power FET M1 2 is fully turned on and passes the load current Iload from the external power supply Vss 6 to the external load 8. Meanwhile, a sense current Is, that is a portion of the load current Iload, flows through a sense FET M2 4 and a sense resistor Rsense thus developing a sense voltage Vs across the sense resistor Rsense. The feedback loop 12 has a current limiting amplifier 10 with its output 10c driving the common power gate 3b of power FET M1 2 and sense FET M2 4 thus controlling their respective on-resistances. The first input 10a and the second input 10b of the current limiting amplifier 10 are respectively connected to the fixed reference voltage VR and the sense voltage Vs. Under normal operation where the sense current Is is small, the corresponding sense voltage Vs is smaller than the fixed reference voltage VR thus leaving the feedback loop 12 open (the current limiting amplifier output 10c goes into a high-impedance state). However, upon shorting of the external load 8, the load current Iload together with the sense current Is increase drastically causing a corresponding increase of the sense voltage Vs. Upon the sense voltage Vs reaching the fixed reference voltage VR, the feedback loop 12 gets closed via the current limiting amplifier 10 and continuously controls the common power gate 3b of power FET M1 2 and sense FET M2 4 so as to hold the sense voltage Vs equal to the fixed reference voltage VR with the corresponding load current Iload limited to the pre-settable maximum Imax. As another feature of the prior art CLLS 1, it includes a soft-start control circuit 18, having its output in parallel connection with the current limiting amplifier 10 output, for controlling the common power gate 3b of power FET M1 2 and sense FET M2 4 and effecting a controlled slew-rate of the load voltage Vload during power-up. After soft-start, the common power gate 3b is pulled low such that the power FET M1 2 is fully turned on and operates in linear region with a low on-resistance Rdson. To those skilled in the art, as the current limiting amplifier output 10c remains in a high-impedance state during soft-start of the switching circuit, there is no functional interference between the soft-start control circuit 18 and the feedback loop 12. To avoid excessive obscuring details, the internal circuitry of the soft-start control circuit 18 is not illustrated here.

Turning now to a more detailed subsystem level description of the prior art CLLS 1. Power FET M1 2 is the main pass transistor with a low on-resistance Rdson that connects and disconnects the external power supply Vss 6 to the external load 8. Power FET source 2a (S1) is connected to external power supply Vss 6 and common power drain 3c (D) is connected to load voltage Vload of the external load 8. Sense FET M2 4, in this case also a PMOS FET, is a current sensing transistor and it can be made as a small portion of the same semiconductor die as power FET M1 2 with the following being a typical example of selected FET channel width-to-channel length ratio (W/L):

$$\text{RATIO}_I = I_s/I_{power} = 0.001 \quad (A)$$

where $\text{RATIO}_I \approx W/L(\text{sense FET M2 }\mathbf{4})/W/L(\text{power FET M1 }\mathbf{2})$ Equation (A) gives the value of $\text{RATIO}_I$ when the voltages across the sense FET M2 4 and power FET M1 2 are equal. However, if the voltages across the FETs are not equal, $\text{RATIO}_I$ may change, as will be shown later. The on resistance ratio, $\text{RATIO}_R$ of the FETs is fixed whether the FETs are operating in saturation region or linear region:

$$\text{RATIO}_R = R_{on}(\text{power }FET\,M1\,\mathbf{2})/R_{on}(\text{sense }FET\,M2\,\mathbf{4}) = \text{constant}$$

In accordance with equation (A), $\text{RATIO}_R$ can be set to 0.001.

For the purpose of current sensing while maintaining power efficiency, the following criterion is generally followed:

$$\text{RATIO}_I \ll 1$$

In which case, Ipower≈Iload. Thus, more generally $\text{RATIO}_I$ can be selected within the following range:

$\text{RATIO}_I$ ranges from about 0.0001 to about 0.1

In essence, power FET M1 2 and sense FET M2 4 are interconnected in a split-source configuration with common power gate 3b and common power drain 3c but a separate sense FET source 4a. In view of equation (A), the load current Iload can therefore be indirectly sensed via sense current Is as it develops a sense voltage Vs across the sense resistor Rsense connected between the sense FET source 4a and the external power supply Vss 6.

As part of the feedback loop 12, the sense voltage Vs is fed to the second input 10b terminal of the current limiting amplifier 10. As another part of the feedback loop 12, the preset fixed reference voltage VR is generated with a VR-generator 14 and is fed to the first input 10a terminal of the current limiting amplifier 10. Within the VR-generator 14, the fixed reference voltage VR is developed across a voltage reference resistor Rref connected between the external power supply Vss 6 and a current output node of the pre-settable current mirror 16 with output current=I6. The output current I6 is drain current of an FET M6 that is part of a current mirror pair (FET M5 and FET M6) wherein the FET M5 is loaded with a current source 16a providing a constant current:

$$I4=Iset$$

where "Iset" is a pre-settable current level set with an external current setting resistor Rset. Finally, the Iset would, through current mirroring into the output current I6(I6=I4=Iset) then developing the fixed reference voltage VR, cause the feedback loop 12 to limit the load current Iload to the pre-settable maximum Imax upon Vs>VR, which can occur during shorting of the external load 8.

FIG. 1B is an example plot of sense current Is and power current Ipower plus a number of other internal signals of the prior art CLLS 1 versus the load resistance Rload. Additionally, the output impedance (Ro2) of sense FET M2 4 is also plotted. In view of equation (A), Ipower is essentially equal to the load current Iload and thus represents Iload. In this example:

Imax=2.8 Amp (ampere)

VR=43 mV (milliVolt)

It can be seen that while Rload is large (>about 4.2 Ohm) Iload stays below Imax (Region A right side). Here the power FET M1 2 is approximately fully turned on with its common power gate 3b pulled all the way to a low level. As Rload gets continuously reduced, Iload keeps rising. While Iload eventually gets reduced and limited to Imax by the feedback loop 12 for Rload<about 2.7 Ohm (Region B), an anomaly zone of 2.7 Ohm<Rload<4.2 Ohm nevertheless exists wherein an unacceptably high transitional Iload overshoot 50 beyond Imax takes place (Region A left side). In this case, the transitional Iload overshoot 50 reaches as much as 4.4 Amp beyond Imax (2.8 Amp) before the feedback loop 12 closes and limits the current to Imax (Region B). It is therefore important to identify the cause of this transitional Iload overshoot 50 then mitigate it with proper modification of the prior art CLLS 1.

SUMMARY OF THE INVENTION

A current limiting load switch (CLLS) with dynamically generated tracking reference voltage $VR_{dt}$ is proposed. The CLLS includes:

A pair of power FET and sense FET for bridging an external power supply Vss and an external load. The CLLS develops a load voltage Vload across the external load while automatically limits a resulting load current Iload to a pre-settable maximum Imax. The FET pair is interconnected in a split-current configuration with a common power gate and a common low-side terminal while respectively sized to draw device currents Ipower and Is with a corresponding current ratio of $RATIO_I$=Is/Ipower<<1. The power FET high-side terminal is connected to Vss while the sense FET high-side terminal is coupled to Vss through a serial sense resistor Rsense for developing a sense voltage Vs=Is× Rsense across it.

A current limiting amplifier with its first input connected to the $VR_{dt}$, its second input connected to the low side of Rsense and its output connected to the common power gate thus closing a feedback loop through the sense FET. Upon a tendency of Vs to exceed $VR_{dt}$, the current limiting amplifier thus limits Vs to $VR_{dt}$.

A $VR_{dt}$-generator circuit for generating the $VR_{dt}$. The $VR_{dt}$-generator is coupled to Vload such that, upon a tendency of Iload to increase beyond Imax causing an operational transition of the sense FET from its linear region to its saturation region, the $VR_{dt}$-generator automatically and dynamically adjusts the $VR_{dt}$ through a level transition concurrent and substantially compensatory with an undesirable effect of changing $RATIO_I$ caused by the sense FET operational transition. In the absence of the automatic and dynamic $VR_{dt}$-adjustment, the changing $RATIO_I$ would otherwise result in a substantial transitional overshoot of Iload beyond Imax.

In a more specific embodiment, the $VR_{dt}$-generator includes:

A tracking active bias network of serial connection of high-side tracking resistor, tracking FET and a low-side branch point. The tracking active bias network bridges Vss and Vload while sinking a tracking bias current from Vss and drawing a tracking coupling current from Vload. The voltage drop across the high-side tracking resistor is equal to the $VR_{dt}$ in that its low-side is connected to the first input of the current limiting amplifier. The high-side tracking resistor is further sized such that when the tracking bias current equals a pre-settable current Iset and the sense FET operates in saturation region, the corresponding $VR_{dt}^*$:

$$VR_{dt}^*=Iset \times \text{high-side tracking resistance}$$

limits Vs to $VR_{dt}^*$ via the feedback loop with a corresponding Iload equal to the pre-settable Imax. As Rload continues to drop, $VR_{dt}$ approaches $VR_{dt}^*$ but does not exceed it. The low-side branch point further sinks a first bias current with:

$$\text{first bias current=tracking bias current+tracking coupling current.}$$

A fixed current active bias network includes a serial connection of a high-side fixed current bias resistor and a fixed current bias FET hooked up in saturation region. The fixed current active bias network is connected to Vss for sinking a second bias current from it with:

$$\text{second bias current=Iset}$$

such that:

a) When the sense FET operates in saturation region, the potential of the low-side branch point places the tracking FET also in saturation forming a current mirror with the fixed current bias FET. This forces the tracking bias current to equal Iset, causes $VR_{dt}$ to equal $VR_{dt}^*$ thus limits the corresponding Iload to Imax.

b) When the sense FET operates in linear region, the potential of the low-side branch point places the tracking FET also in linear region with a reduced tracking bias current below Iset. This causes $VR_{dt}$ to be less than $VR_{dt}^*$ thus avoids the transitional overshoot of Iload beyond Imax.

In a more specific embodiment, for drawing the tracking coupling current from Vload, the tracking active bias network further includes a passive resistive coupling network for bridging the low-side of tracking FET and Vload. The passive resistive coupling network has a first coupling resistor and a second coupling resistor serially joined at the low-side branch point.

In a preferred embodiment, for maximizing ranges of choices when sizing the circuit components of the tracking active bias network to insure a $VR_{dt}$ level transition concurrent and substantially compensatory with the changing $RATIO_f$, the first bias current is further set within a range of from about 1.2×Iset to about 5×Iset. In an even more preferred embodiment, the first bias current is set at about 2×Iset.

In a more specific embodiment, the $VR_{dt}$-generator includes a pre-settable dual current source bridging both the low-side branch point and the low side of the fixed current active bias network to ground thus sinking the first bias current and the second bias current to ground.

In a more specific embodiment, the pre-settable dual current source includes a three-branch current mirror with:

A first current branch configured to generate the pre-settable current Iset.

A second current branch configured to sink the first bias current at a mirrored level of 2×Iset.

A third current branch configured to sink the second bias current at a mirrored level of Iset.

In a more specific embodiment, while Vs is lower than $VR_{dt}$, the current limiting amplifier is designed so that its output goes into a high-impedance state to open the feedback loop thus keeping the current limiting load switch free of an irrelevant hence undesirable interference from an otherwise closed feedback loop.

In another embodiment, the CLLS further includes a soft-start control circuit for controlling the common power gate thus effecting a controlled slew-rate of the Vload during power-up. The soft-start control circuit has its output in parallel connection with the current limiting amplifier output.

In a more specific embodiment, both the power FET and the sense FET can be either P-channel metal-oxide-semiconductor (PMOS) or N-channel metal-oxide-semiconductor (NMOS) devices.

In a preferred embodiment, the $RATIO_f$ is selected to range from about 0.0001 to about 0.1.

These aspects of the present invention and their numerous embodiments are further made apparent, in the remainder of the present description, to those of ordinary skill in the art.

BRIEF DESCRIPTION OF THE DRAWINGS

In order to more fully describe numerous embodiments of the present invention, reference is made to the accompanying drawings. However, these drawings are not to be considered limitations in the scope of the invention, but are merely illustrative.

FIG. 1C and FIG. 1D respectively illustrates operating state of the control circuit portion of the prior art CLLS within two separate operating regions;

FIG. 2A illustrates the present invention CLLS for coupling an external power supply to an external load; and FIG. 2B is an example plot of power current Ipower plus a number of other internal signals of the present invention CLLS versus the load resistance Rload.

DETAILED DESCRIPTION OF SPECIFIC EMBODIMENTS

The description above and below plus the drawings contained herein merely focus on one or more currently preferred embodiments of the present invention and also describe some exemplary optional features and/or alternative embodiments. The description and drawings are presented for the purpose of illustration and, as such, are not limitations of the present invention. Thus, those of ordinary skill in the art would readily recognize variations, modifications, and alternatives. Such variations, modifications and alternatives should be understood to be also within the scope of the present invention.

FIG. 1C illustrates the simplified operating state of the control circuit portion of the prior art CLLS 1 within an operating region A. FIG. 1D illustrates the same for region B. Correspondingly, FIG. 1E and FIG. 1F respectively illustrates sense current Is and sense voltage Vs behavior versus load resistance Rload of the prior art CLLS 1. The control circuit portion includes split-source power FET M1 2 and sense FET M2 4 plus the feedback loop 12. Throughout FIG. 1C to FIG. 1F the following example is selected for the purpose of illustration only:

$RATIO_f=0.001$

Figure 1A:
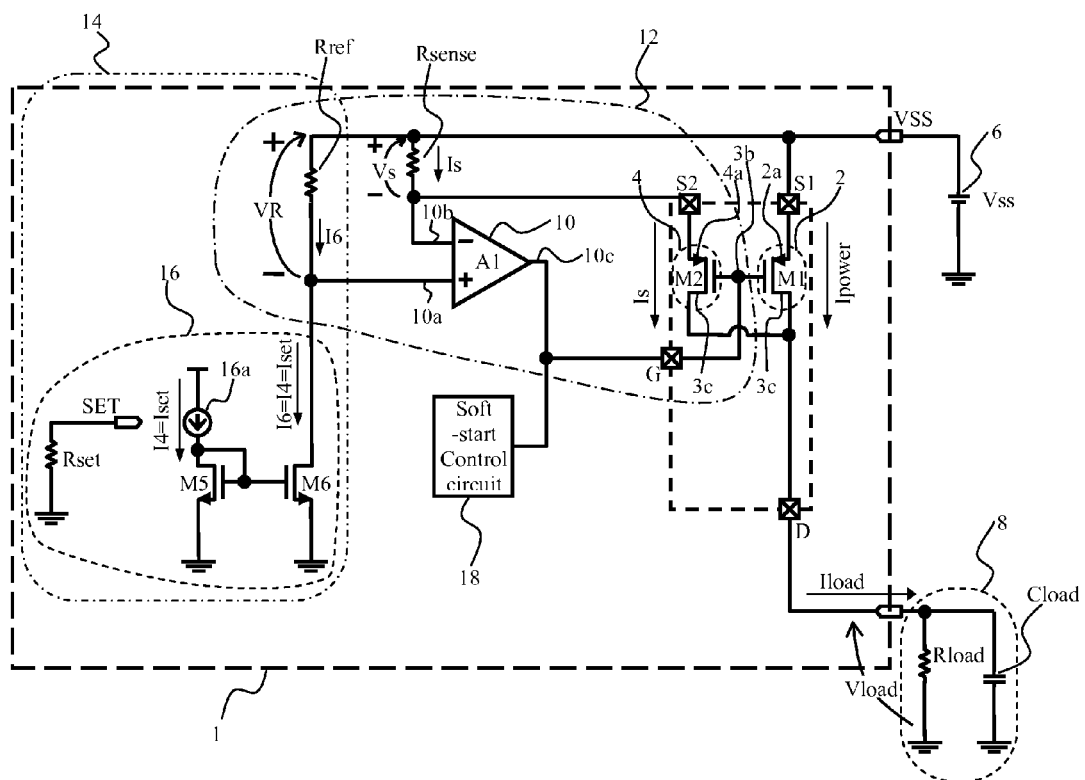
FIG. 1A illustrates the prior art current limiting load switch (CLLS) for coupling an external power supply to an external load.

The following notations are defined for a more detailed description of region A:
Ro1=drain-to-source resistance of power FET M1 2
Ro2=drain-to-source resistance of sense FET M2 4
Ron=linear on resistance of power FET M1 2 (Rdson1)
Rsense=sense resistance
Is1=sense current when Vs<VR1
Ids=drain-to-source current
Vgs=gate-to-source voltage
Vs1=sense voltage when Iload<Imax
VR1=required reference voltage for the current limiting amplifier 10 to trigger (close the feedback loop 12) when Iload reaches Imax In region A (FIG. 1C, right side of FIG. 1E and FIG. 1F) the prior art CLLS 1 is under normal operation with:

Vs1=Is1*Rsense<VR1 feedback loop 12 stays open
common power gate 3b is pulled low with (for example, this can be done by the soft-start control circuit 18 of FIG. 1A)
power FET M1 2 and sense FET M2 4 are both fully turned on and operate in linear region $$Iload \approx Ipower = \frac{Vss}{Ron + Rload} \quad (1)$$

$$Is1 = \left(\frac{Ro1}{Ro1 + (Ro2 + Rsense)}\right) * Iload \quad (2)$$
$$= \left(\frac{Ron}{Ron + (1000*Ron + Rsense)}\right) * Iload$$

Similarly, the following notations are defined for a more detailed description of region B:
Ro1=drain-to-source resistance of power FET M1 2
Ro2=the drain-to-source resistance of sense FET M2 4
Rsense=sense resistance
Is2=sense current when Iload=Imax
Ids=drain-to-source current
Vgs=gate-to-source voltage Vs2=sense voltage when Iload=Imax VR2=required reference voltage to keep Iload at Imax when the feedback loop 12 is closed In region B (FIG. 1D, left side of FIG. 1E and FIG. 1F) the prior art CLLS 1 is under current limiting operation with the feedback loop 12 closed and:

$$Vs2 = Is2 * Rsense = VR2$$

Vgs of sense FET M2 4 is controlled by the feedback loop 12 limiting Iload to Imax Whenever Rload changes within region B, Vgs of sense FET M2 4 is adjusted accordingly by the feedback loop 12 to maintain Iload at Imax $$Iload \approx Ipower = \frac{Vss}{Ro1 + Rload} \quad (3)$$

$$Ro2 = 1000 * Ro1$$

$$Iload = \frac{Ro1 + Ro2 + Rsense}{Ro1} * Is2 \approx 1000 * Is2 \quad (4)$$

(if $Rsense \ll Ro1 \ll Ro2$)

$$Is2 \approx \left(\frac{1}{1000}\right) * Iload = \frac{Imax}{1000} \quad (5)$$

Figure 1B:
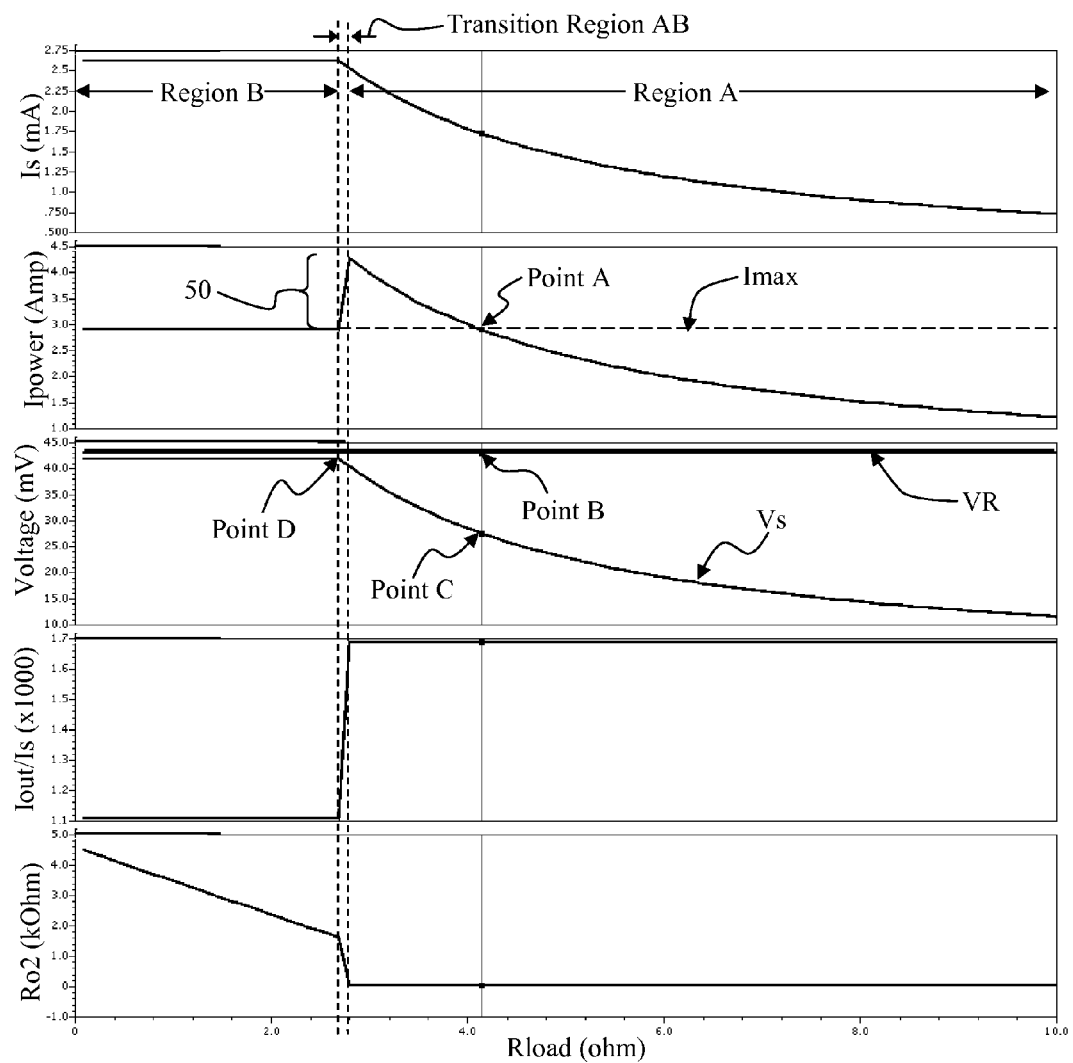
FIG. 1B is an example plot of power current Ipower plus a number of other internal signals of the prior art CLLS versus the load resistance Rload.
Figure 1E:
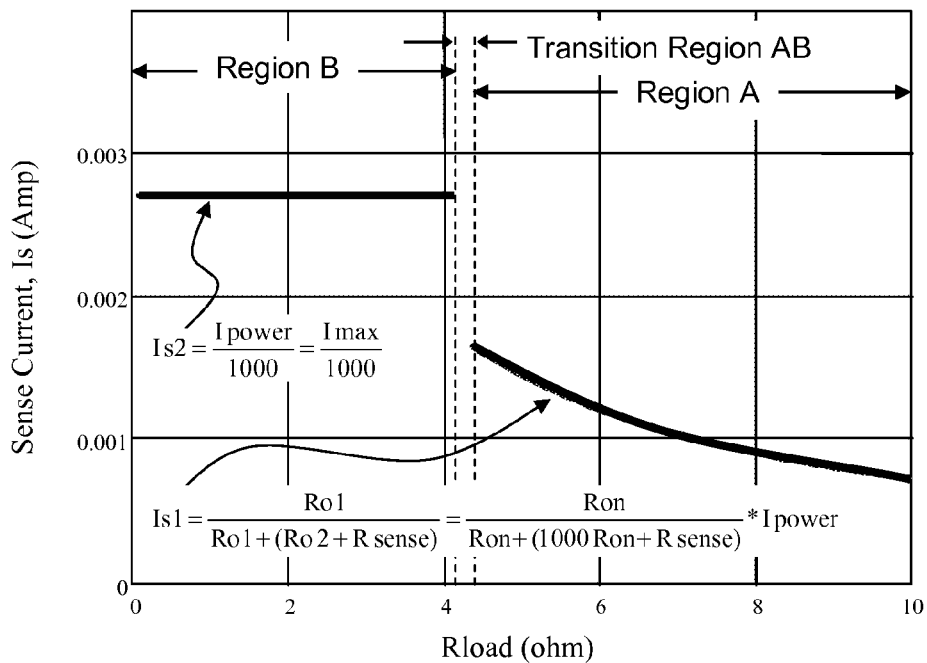
FIG. 1E and FIG. 1F respectively illustrates sense current and sense voltage behavior versus load resistance Rload of the prior art CLLS.
Figure 1F:
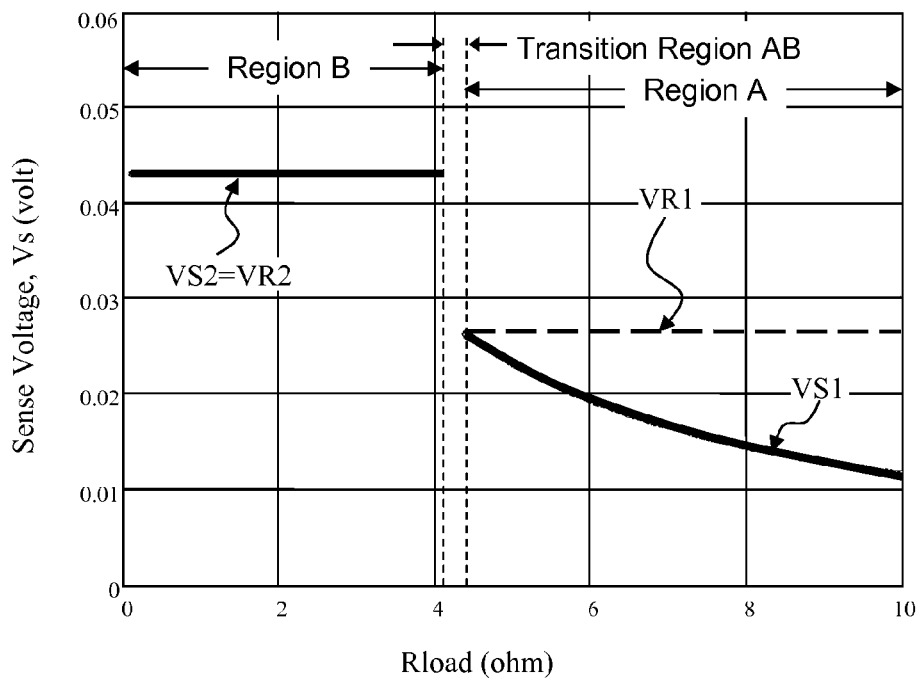

Using the various equations above, the behavior of sense current Is and sense voltage Vs versus load resistance Rload of the prior art CLLS 1 are calculated then plotted in FIG. 1E and FIG. 1F. A discontinuity in sense currents between region A and region B (Is1 and Is2) can be seen in FIG. 1E. This discontinuity comes from the fact that the value of sense resistance Rsense is comparable to the on-resistance of the sense FET M2 4 (Ron2=1000 Ron) when the sense FET M2 is fully turned on and has relatively little drain to source resistance Ro2, as is the case in Region A. However in Region B, the sense FET M2 is operating in the saturation region, so its drain to source resistance Ro2 is high, and sense resistance Rs becomes negligible. Thus RATIO$_I$ for Region A and Region B are different, as illustrated in Equations (2) and (5), and as shown in FIG. 1B. This causes the reference voltage required to close the feedback loop 12 in Region A, VR1, to be lower than that required to close the feedback loop 12 thus limiting Iload at Imax in Region B, VR2. However, the prior art CLLS 1 circuit has only one fixed reference voltage VR for the feedback loop 12. Consequently, as was already noted in FIG. 1B before, within the anomaly zone of 2.7 Ohm<Rload<4.2 Ohm an unacceptably high transitional Iload overshoot 50 beyond Imax takes place. In this example, the transitional Iload overshoot 50 reaches as much as 4.4 Amp which is far beyond Imax (2.8 Amp). Within this anomaly zone, as load resistance Rload decreases and Iload first reaches Imax (point A, 2.8 Amp), the developed sense voltage Vs (point C, 30 mV) still remains far below the fixed reference voltage VR (point B, 43 mV). Accordingly, the feedback loop 12 remains open. Rload needs to be further decreased until the developed sense voltage Vs finally reaches the fixed reference voltage VR (point D, 42 mV) to close the feedback loop 12, causing the power FET M1 2 and sense FET M2 4 to enter saturation region (Region B) then dropping Iload to the preset Imax.

To solve the above problem of transitional Iload overshoot as caused by the sense current discontinuity, a present invention CLLS 101 illustrated in FIG. 2A is proposed for coupling the external power supply Vss 6 to the external load 8. While the split-source transistor pair power FET M1 2 plus sense FET M2 4 and the feedback loop 12 are topologically similar to those illustrated in FIG. 1A, the present invention CLLS 101 instead employs a dynamic tracking reference voltage generator VR$_{dt}$-generator 114 that adjusts the reference voltage VR$_{dt}$ dynamically according to the operation regions of the switching split-source transistor pair (2 and 4). The VR$_{dt}$-generator 114 is coupled to Vload such that, upon a tendency of Iload to increase beyond Imax causing an operational transition of the sense FET M2 4 from its linear region to its saturation region, the VR$_{dt}$-generator 114 automatically and dynamically adjusts the VR$_{dt}$ through a level transition concurrent and substantially compensatory with an undesirable effect of changing RATIO$_I$ caused by the sense FET M2 4 operational transition. As a result, the present invention CLLS 101 can insure a smooth transition of Iload from the linear operation region (Region A) to the saturation region (Region B) free of the otherwise transitional Iload overshoot 50 present in the prior art. The corresponding power current Ipower plus a number of other internal signals of the present invention CLLS 101 versus load resistance Rload are plotted in FIG. 2B as an example.

Turning now to a more detailed subsystem level description of the VR$_{dt}$-generator 114, it includes a tracking active bias network having a serial connection of a high-side tracking resistor R4, a tracking FET M3 and a low-side branch point 116. The tracking active bias network bridges the external power supply Vss 6 and Vload for sinking a tracking bias current I6 from Vss 6 and drawing a tracking coupling current I7 from Vload. The voltage developed across the high-side tracking resistor R4 is the reference voltage VR$_{dt}$ in that the low-side of R4 is connected to the first input 10$a$ of the current limiting amplifier 10. Furthermore, the high-side tracking resistor R4 is sized such that when the tracking bias current I6 equals a pre-settable current Iset and the sense FET M2 4 is operating in saturation region, the corresponding VR$_{dt}$*:

$$VR_{dt}* = Iset \times R4$$

limits Vs to VR$_{dt}$* via the feedback loop 12 with a corresponding Iload less than or equal to the pre-settable Imax. As the Rload continues to drop, VR$_{dt}$ gets closer to VR$_{dt}$*. The low-side branch point 116 further sinks a first bias current I3 with:

first bias current I3=tracking bias current I6+tracking coupling current I7.

For drawing the tracking coupling current I7 from Vload, the tracking active bias network further includes a passive resistive coupling network having a first coupling resistor R6 and a second coupling resistor R7 serially joined at the low-side branch point 116. The passive resistive coupling network thus bridges the low-side of tracking FET M3 and Vload.

The VR$_{dt}$-generator 114 has an additional fixed current active bias network having a serial connection of a high-side fixed current bias resistor R5 and a fixed current bias FET M4 hooked up in saturation region. The fixed current active bias network is connected to Vss 6 for sinking a second bias current I2 from it with:

R5=R4 second bias current I2=Iset

The numerous circuit components of the tracking active bias network and the fixed current active bias network are sized such that:

a) When the sense FET M2 4 is operating in saturation region, the potential of the low-side branch point 116 places the tracking FET M3 in saturation forming a current mirror with the fixed current bias FET M4 thus forcing the tracking bias current I6 equal to Iset (Iset=I2), causing VR$_{dt}$ to equal VR$_{dt}$* and limiting the corresponding Iload to Imax.

b) When the sense FET M2 4 is operating in linear region, the potential of the low-side branch point 116 places the tracking FET M3 in linear region with a reduced tracking bias current I6 below Iset, causing $VR_{dt}$ to be sufficiently lower than $VR_{dt}$* thus avoiding the transitional Iload overshoot 50 beyond Imax.

To supply the numerous source currents mentioned above, the $VR_{dt}$-generator 114 further includes a pre-settable dual current source 118 bridging both the low-side branch point 116 and the low side of the fixed current active bias network to ground thus sinking the first bias current I3 and the second bias current I2 to ground. In turn, the pre-settable dual current source 118 further includes the following three-branch current mirror:

A first current branch with current source Iset 120 and FET M7 configured to generate the pre-settable current I4=Iset (which value depends on the external resistor Rset, not shown here for simplicity)
  A second current branch with FET M8 configured to sink the first bias current I3 at a mirrored level of I3=2×Iset
  A third current branch with FET M9 configured to sink the second bias current I2 at a mirrored level of I2=Iset As shown in FIG. 2B under the present invention, except for a very slight glitch around Rload~4.5 Ohm, the Iload versus Rload characteristics now increases asymptotically toward Imax (2.8 Amp) with a continuously decreasing Rload throughout its full range (10 Ohm-0 Ohm). Equally important, the Iload versus Rload characteristics is now free of any transitional Iload overshoot beyond Imax within a transition region AB that is between region A and region B. Owing to the split-source configuration of power FET M1 2 and sense FET M2 4 with a current ratio of $RATIO_I$=Is/Ipower=0.001, the shape of the Is versus Rload characteristics exhibits a general similarity to the Iload versus Rload characteristics except within the transition region AB wherein the power FET M1 2 and sense FET M2 4 go through a rapid transition from linear to saturated operation. While the Ipower/Is ratio still experiences a rapid change within the transition region AB (from about 1700 to about 1100), the tracking reference voltage $VR_{dt}$ gets dynamically adjusted by the $VR_{dt}$-generator 114 through a level transition concurrent and substantially compensatory with an undesirable effect of the changing $RATIO_I$, hence resulting in the present invention Iload versus Rload characteristics that is free of any transitional Iload overshoot beyond Imax. As a reference plot, the sense voltage Vs versus Rload characteristics stays below $VR_{dt}$ in region A signifying an open feedback loop 12. However, the sense voltage Vs versus Rload characteristics slightly exceeds $VR_{dt}$ in region B signifying a closed feedback loop 12 (In FIG. 2B the difference between Vs and $VR_{dt}$ in Region B can be attributed to an input offset in the current limiting amplifier 10). As another reference plot, the Ro2 (drain-to-source resistance of sense FET M2 4) versus Rload characteristics exhibits a very low value in region A (linear region) but it then increases rapidly in region B (saturation region). As a reference, the example plot of FIG. 2B is based upon the following numerical circuit design parameters for the present invention CLLS 101 of FIG. 2A:

power FET M1 2 Rdson=20 mΩ sense FET M2 4 Rdson=20 Ω tracking FET M3 Rdson=40 kΩ

Rsense=16 Ω

R4=R5=4.5 kΩ

R6=50 kΩ

R7=25 kΩ

Iset=I2=10 μA

I3=2*Iset=20 μA

Vss=12 Volt

Imax=2.8 Amp

Cload=1 μF

To those skilled in the art, by now it should become clear that, based upon the same inventive concept of the present invention as described, the above numerical circuit design parameters for the CLLS can be adjusted to suit other performance specifications as well, such as different Vss and Imax values. Such circuit design parameter adjustment can also be accelerated with the assistance of circuit simulation tools available in the art.

In conclusion, by employing an as-described dynamically generated tracking reference voltage in a current-limiting feedback loop, a load switch can now guarantee a load current limited to a preset current-limit level throughout the whole range of load resistance. While the present invention is presented with the power FET and sense FET interconnected in a split-source configuration, to those skilled in the art the present invention should be applicable to more general cases wherein the power FET and sense FET are interconnected in a split-current configuration with a common power gate and a common low-side terminal. Likewise, while the present invention is presented with the power FET and sense FET being PMOS devices, to those skilled in the art the present invention should be applicable to cases wherein the power FET and sense FET are N-channel metal-oxide-semiconductor (NMOS) devices instead. Furthermore, while the $VR_{dt}$-generator 114 is illustrated with the first bias current I3 set at a mirrored level of I3=2×Iset, for maximizing ranges of choices when sizing the circuit components of the tracking active bias network to insure a $VR_{dt}$ level transition concurrent and substantially compensatory with the changing $RATIO_I$, it has been determined through circuit simulation that the first bias current I3 can be more broadly set within a range of from about 1.2×Iset to about 5×Iset, by way of example and not by way of limitation.

Throughout the description and drawings, numerous exemplary embodiments were given with reference to specific configurations. It will be appreciated by those of ordinary skill in the art that the present invention can be embodied in numerous other specific forms and those of ordinary skill in the art would be able to practice such other embodiments without undue experimentation. The scope of the present invention, for the purpose of the present patent document, is hence not limited merely to the specific exemplary embodiments of the foregoing description, but rather is indicated by the following claims. Any and all modifications that come within the meaning and range of equivalents within the claims are intended to be considered as being embraced within the spirit and scope of the present invention.

What is claimed are:

1. A current limiting load switch (CLLS) with dynamically generated tracking reference voltage $VR_{dt}$, the CLLS comprising:

a pair of power FET and sense FET being interconnected in split-current configuration with a common power gate and a common low-side terminal for bridging an external power supply Vss and an external load thus developing a load voltage Vload while, upon saturation of the FET pair, automatically limiting a resulting load current Iload to a pre-settable maximum Imax, the FET pair being sized to draw respective device currents Ipower and Is with a corresponding current ratio $RATIO_I=Is/Ipower \ll 1$, the sense FET high-side terminal being coupled to Vss through a sense resistor Rsense for developing a sense voltage $Vs=Is \times Rsense$ there across;

a current limiting amplifier with its first input connected to a dynamic tracking reference voltage $VR_{dt}$, its second input connected to the low side of Rsense and its output connected to the common power gate thus closing a feedback loop through the sense FET that, upon a tendency of Vs to exceed $VR_{dt}$, limits Vs to $VR_{dt}$; and a $VR_{dt}$-generator circuit for generating the $VR_{dt}$, the $VR_{dt}$-generator being further coupled to Vload such that, upon a tendency of Iload to increase beyond Imax causing an operational transition of the sense FET from its linear region to its saturation region, said $VR_{dt}$-generator automatically and dynamically adjusts the $VR_{dt}$ through a level transition concurrent and substantially compensatory with an undesirable effect of changing $RATIO_I$ caused by the sense FET operational transition that, in the absence of the automatic and dynamic $VR_{dt}$-adjustment, would otherwise result in a substantial transitional overshoot of Iload beyond Imax, wherein the $VR_{dt}$-generator further comprises:

a tracking active bias network, having a serial connection of high-side tracking resistor, tracking FET and a low-side branch point therein, bridging Vss and Vload for sinking a tracking bias current from Vss and drawing a tracking coupling current from Vload, the voltage drop across the high-side tracking resistor being equal to said $VR_{dt}$ in that its low-side is further connected to the first input of the current limiting amplifier, the high-side tracking resistor is further sized such that when the tracking bias current equals a pre-settable current Iset and the sense FET operates in saturation region, the corresponding $VR_{dt}*$:

$VR_{dt}* = Iset \times$ high-side tracking resistance limits Vs thereto via the feedback loop with a corresponding Iload equal to the pre-settable Imax, said low-side branch point further sinks a first bias current with:

first bias current=tracking bias current+tracking coupling current; and a fixed current active bias network, having a serial connection of a high-side fixed current bias resistor and a fixed current bias FET hooked up in saturation region therein, connected to Vss for sinking a second bias current there from with:

second bias current=Iset such that:
a) when the sense FET operates in saturation region, the potential of the low-side branch point places the tracking FET in saturation forming a current mirror with the fixed current bias FET thus forcing the tracking bias current equal to Iset, causing $VR_{dt}$ to equal $VR_{dt}*$ whereby limiting the corresponding Iload to Imax; and
b) when the sense FET operates in linear region, the potential of the low-side branch point places the tracking FET in linear region with a reduced tracking bias current below Iset, causing $VR_{dt}$ to be less than $VR_{dt}*$ whereby avoiding the transitional overshoot of Iload beyond Imax.

2. The current limiting load switch of claim 1 wherein, for drawing the tracking coupling current from Vload, the tracking active bias network further comprises a passive resistive coupling network, having a first coupling resistor and a second coupling resistor serially joined at the low-side branch point, bridging the low-side of said tracking FET and said Vload.

3. The current limiting load switch of claim 2 wherein, for maximizing ranges of choices when sizing the circuit components of the tracking active bias network to insure a $VR_{dt}$ level transition concurrent and substantially compensatory with the changing $RATIO_I$, said first bias current is further set within a range of from about 1.2×Iset to about 5×Iset.

4. The current limiting load switch of claim 3 wherein said first bias current is further set at about 2×Iset.

5. The current limiting load switch of claim 1 wherein the $VR_{dt}$-generator further comprises a pre-settable dual current source bridging both the low-side branch point and the low side of the fixed current active bias network to ground whereby sinking the first bias current and the second bias current to ground.

6. The current limiting load switch of claim 5 wherein the pre-settable dual current source further comprises a three-branch current mirror with:
a first current branch configured to generate the pre-settable current Iset;
a second current branch configured to sink the first bias current at a mirrored level within a range of from about 1.2×Iset to about 5×Iset; and
a third current branch configured to sink the second bias current at a mirrored level of Iset.

7. The current limiting load switch of claim 6 wherein the second current branch is further configured to sink the first bias current at a mirrored level of about 1.2×Iset.

8. A current limiting load switch (CLLS) with dynamically generated tracking reference voltage $VR_{dt}$, the CLLS comprising:
a pair of power FET and sense FET being interconnected in split-current configuration with a common power gate and a common low-side terminal for bridging an external power supply Vss and an external load thus developing a load voltage Vload while, upon saturation of the FET pair, automatically limiting a resulting load current Iload to a pre-settable maximum Imax, the FET pair being sized to draw respective device currents Ipower and Is with a corresponding current ratio $RATIO_I=Is/Ipower \ll 1$, the sense FET high-side terminal being coupled to Vss through a sense resistor Rsense for developing a sense voltage $Vs=Is \times Rsense$ there across;

a current limiting amplifier with its first input connected to a dynamic tracking reference voltage $VR_{dt}$, its second input connected to the low side of Rsense and its output connected to the common power gate thus closing a feedback loop through the sense FET that, upon a tendency of Vs to exceed $VR_{dt}$, limits Vs to $VR_{dt}$;

a $VR_{dt}$-generator circuit for generating the $VR_{dt}$, the $VR_{dt}$-generator being further coupled to Vload such that, upon a tendency of Iload to increase beyond Imax causing an operational transition of the sense FET from its linear region to its saturation region, said $VR_{dt}$-generator automatically and dynamically adjusts the $VR_{dt}$ through a level transition concurrent and substantially compensatory with an undesirable effect of changing $RATIO_I$ caused by the sense FET operational transition that, in the absence of the automatic and dynamic $VR_{dt}$-adjustment, would otherwise result in a substantial transitional overshoot of Iload beyond Imax; wherein, while Vs is lower than $VR_{dt}$, the current limiting amplifier output goes into a high-impedance state to open the feedback loop thus keeping the current limiting load switch free of an irrelevant hence undesirable interference from an otherwise closed feedback loop; and a soft-start control circuit, having its output in parallel connection with the current limiting amplifier output, for controlling the common power gate thus effecting a controlled slew-rate of the Vload during power-up.

9. A method for improving a current limiting load switch (CLLS) comprising:

a pair of split-current power field effect transistor (FET) and sense FET with a common power gate for bridging an external power supply Vss and an external load thus developing a load voltage Vload while limiting a resulting load current Iload to a pre-settable maximum Imax, the power FET and sense FET being respectively sized to draw device currents Ipower and Is with a corresponding current ratio $RATIO_f=Is/Ipower\ll 1$, the power FET high-side terminal being connected to Vss while the sense FET high-side terminal being coupled to Vss through a serial sense resistor Rsense for developing a sense voltage $Vs=Is\times Rsense$ there across; and a current limiting amplifier with its first input connected to a pre-determined fixed reference voltage $VR_{fx}$, its second input connected to the low side of Rsense and its output connected to the common power gate thus closing a feedback loop through the sense FET that, upon a tendency of Vs to exceed $VR_{fx}$ limits Vs to $VR_{fx}$ with a corresponding Iload=Imax, the method comprises:

replacing the fixed reference voltage $VR_{fx}$ with a dynamic tracking reference voltage $VR_{dt}$ such that, upon a tendency of Iload to increase beyond Imax causing an operational transition of the sense FET from its linear region to its saturation region, the $VR_{dt}$ is automatically and dynamically adjusted through a level transition concurrent and substantially compensatory with an undesirable effect of changing $RATIO_f$ caused by the sense FET operational transition that, in the absence of the automatic and dynamic $VR_{dt}$-adjustment, would otherwise result in a substantial transitional overshoot of Iload beyond Imax; wherein replacing the $VR_{fx}$ with a dynamic tracking reference voltage $VR_{dt}$ further comprises:

providing a tracking active bias network, having a serial connection of high-side tracking resistor, tracking FET and a low-side branch point therein, bridging Vss and Vload for sinking a tracking bias current from Vss and drawing a tracking coupling current from Vload, the voltage drop across the high-side tracking resistor being equal to the $VR_{dt}$ in that its low-side is further connected to the first input of the current limiting amplifier, the high-side tracking resistor is further sized such that when the tracking bias current equals a pre-settable current Iset and the sense FET operates in saturation region, the corresponding $VR_{dt}^*$:

$VR_{dt}^* = Iset \times \text{high-side tracking resistance}$ limits Vs thereto via the feedback loop with a corresponding Iload equal to the Imax, the low-side branch point further sinks a first bias current with:

first bias current=tracking bias current+tracking coupling current; and providing a fixed current active bias network, having a serial connection of a high-side fixed current bias resistor and a fixed current bias FET hooked up in saturation region therein, connected to Vss for sinking a second bias current there from with:

second bias current=Iset such that:

a) when the sense FET operates in saturation region, the potential of the low-side branch point places the tracking FET in saturation forming a current mirror with the fixed current bias FET thus forcing the tracking bias current equal to Iset, causing $VR_{dt}$ to equal $VR_{dt}^*$ whereby limiting the corresponding Iload to Imax; and b) when the sense FET operates in linear region, the potential of the low-side branch point places the tracking FET in linear region with a reduced tracking bias current below Iset, causing $VR_{dt}$ to be less than $VR_{dt}^*$ whereby avoiding the transitional overshoot of Iload beyond Imax.

10. The method of claim 9 wherein, for drawing the tracking coupling current from Vload, providing the tracking active bias network further comprises providing a passive resistive coupling network, having a first coupling resistor and a second coupling resistor serially joined at the low-side branch point, bridging the low-side of the tracking FET and the Vload.

11. The method of claim 9 wherein replacing the $VR_{fx}$ with a dynamic tracking reference voltage $VR_{dt}$ further comprises providing a pre-settable dual current source bridging both the low-side branch point and the low side of the fixed current active bias network to ground whereby sinking the first bias current and the second bias current to ground.

* * * * *